(12) United States Patent
Devadze et al.

(10) Patent No.: US 9,164,858 B2
(45) Date of Patent: Oct. 20, 2015

(54) SYSTEM AND METHOD FOR OPTIMIZED BOARD TEST AND CONFIGURATION

(71) Applicants: GÖPEL electronic GmbH, Jena (DE); Testonica Lab OÜ, Tallinn (EE)

(72) Inventors: Sergei Devadze, Tallinn (EE); Artur Jutman, Tallinn (EE); Igor Aleksejev, Tallinn (EE); Konstantin Shibin, Tallinn (EE); Thomas Wenzel, Jena (DE)

(73) Assignees: TESTONICA LAB OU, Tallinn (EE); GOPEL ELECTRONIC GMBH, Jena (DE)

( * ) Notice: Subject to any disclaimer, the term of this patent is extended or adjusted under 35 U.S.C. 154(b) by 233 days.

(21) Appl. No.: 13/853,713

(22) Filed: Mar. 29, 2013

(65) Prior Publication Data

US 2014/0298125 A1    Oct. 2, 2014

(51) Int. Cl.
*G01R 31/28*    (2006.01)
*G06F 11/26*    (2006.01)
*G01R 31/3185*    (2006.01)

(52) U.S. Cl.
CPC ........ *G06F 11/26* (2013.01); *G01R 31/318516* (2013.01); *G01R 31/318519* (2013.01); *G01R 31/318547* (2013.01)

(58) Field of Classification Search
CPC ................. G01R 31/318536; G01R 31/31858
See application file for complete search history.

(56) References Cited

U.S. PATENT DOCUMENTS

| | | | |
|---|---|---|---|
| 5,835,503 A * | 11/1998 | Jones et al. .................... | 714/719 |
| 5,991,908 A | 11/1999 | Baxter et al. | |
| 6,314,539 B1 | 11/2001 | Jacobson et al. | |
| 6,594,802 B1 | 7/2003 | Ricchetti et al. | |
| 6,766,486 B2 * | 7/2004 | Neeb .............................. | 714/724 |
| 6,807,644 B2 * | 10/2004 | Reis et al. ...................... | 714/724 |
| 6,925,583 B1 | 8/2005 | Khu et al. | |
| 7,047,467 B1 | 5/2006 | Khu et al. | |
| 7,089,470 B1 * | 8/2006 | Baeg et al. ..................... | 714/727 |
| 7,231,552 B2 * | 6/2007 | Parker et al. ..................... | 714/30 |
| 7,248,070 B1 | 7/2007 | Guilloteau et al. | |
| 7,550,995 B1 | 6/2009 | Guilloteau et al. | |
| 7,747,916 B2 * | 6/2010 | Storakers ....................... | 714/726 |
| 8,335,953 B2 * | 12/2012 | Whetsel ......................... | 714/727 |
| 8,527,823 B2 * | 9/2013 | Whetsel ......................... | 714/727 |
| 8,639,981 B2 * | 1/2014 | Chong ............................ | 714/30 |
| 2005/0204229 A1 | 9/2005 | Dubey | |

* cited by examiner

*Primary Examiner* — Esaw Abraham
(74) *Attorney, Agent, or Firm* — Birch, Stewart, Kolasch & Birch, LLP (57) ABSTRACT

The present invention, system and method for optimized board test and configuration, comprises a method for splitting test data into dynamic and static parts, a system for optimized test access using variable-length shift register (VLSR) that uses the latter method, a system for optimized test application using VLSR with accumulating buffer (VLSRB) and a method for switching between BS-based test and VLSR/VLSRB-based test.

12 Claims, 8 Drawing Sheets

| Instruction in IR | Actions on test bus | Test data manipulations | Remarks |
|---|---|---|---|
| SAMPLE/ PRELOAD | IR-shift + DR-shift | Loading the first test pattern to BSR. The pattern may also contain control/disable values for other devices (not only DUT) | |
| EXTEST | IR-shift + DR-shift | 1. Applying pattern 1 to the DUT<br>2. Capturing test responses from DUT in BSR<br>3. Reading back test responses and loading new test pattern to BSR | Test pattern 1 applied and analyzed |
| EXTEST | DR-shift | 1. Applying pattern 2 to the DUT<br>2. Capturing test responses from DUT in BSR<br>3. Reading back test responses and loading new test pattern to BSR | Test pattern 2 applied and analyzed |

↓Time

SYSTEM AND METHOD FOR OPTIMIZED BOARD TEST AND CONFIGURATION

FIELD OF INVENTION

The present invention relates to the field of post-manufacturing test of electronic devices, more specifically to the field of test and in-system configuration of printed-circuit boards (PCBs).

BACKGROUND OF THE INVENTION

Figure 1:
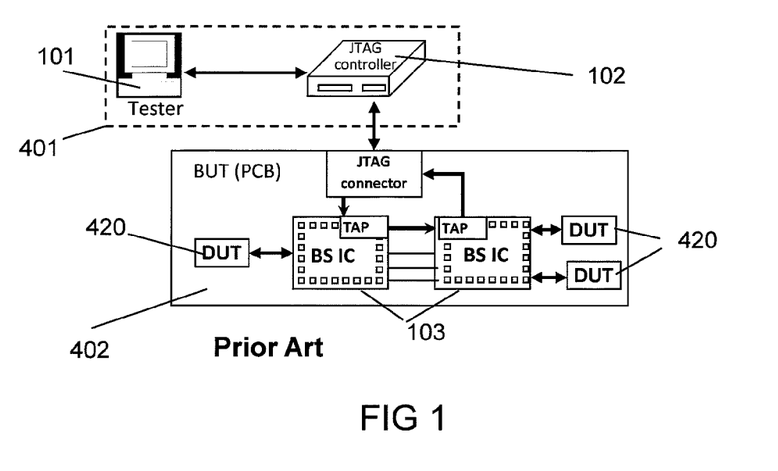
FIG. 1 shows typical BS test setup that includes external tester, BS/JTAG controller and PCB under test which is populated with BS-enabled ICs and also DUT without BS support (prior art)

Boundary Scan (also known as IEEE 1149.1 standard or JTAG, JTAG—Joint Test Action Group) is a technique that is extensively used for testing of printed circuit boards (PCBs). Boundary Scan (BS) provides the possibility for an external tester (JTAG control system 401) to take control over board under test (BUT, 402) and use BS-compliant devices (integrated circuits, ICs) 103 of BUT 402 to carry out tests (FIG. 1). For using BS it is required for BUT 402 to contain one or several BS-compliant ICs 103 that form BS test infrastructure. BS is capable for testing of interconnection between BS-compliant components and also testing and configuration of non-BS components (device under test, DUT, 420) that have connections to BS components.

Test access port (TAP) provides access to the test functions implemented in an BS-complient IC according to IEEE1149.1 standard. TAP consists of TAP controller and four dedicated pins: TCK input pin provides the test clock for test logic defined by JTAG standard. Test clock is essential to perform synchronous board test independently from system clock. TMS input pin is used to control test mode according to the TAP controller states. TDI input pin represents the serial data input of test instructions and test data. TDO output pin is the serial test data output that is used to readback the results of test.

Figure 2:
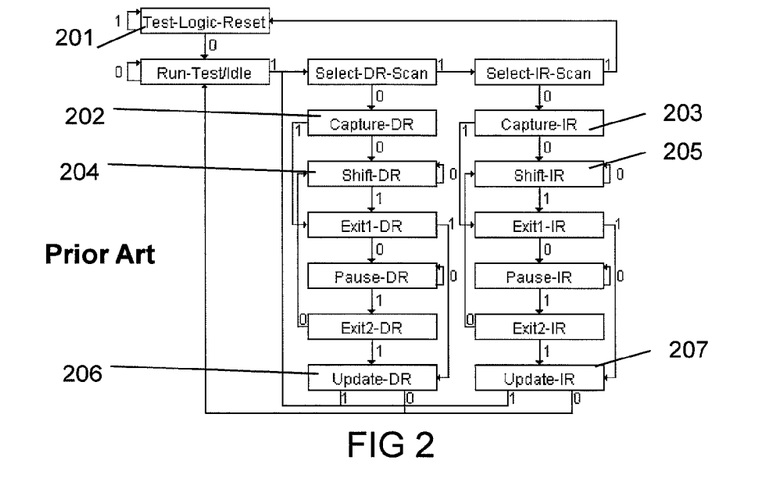
FIG. 2 shows the TAP state machine diagram defined by BS (IEEE 1149.1, JTAG) standard (prior art)

All JTAG operations are regulated by TAP controller. It represents a finite state machine that is controlled by TCK and TMS inputs (FIG. 2). TAP controller controls the behavior of test logic and test data flow through BS structures inside the device. In Test-Logic-Reset state 201 the test logic is disabled so that device can operate normally in functional mode. Capture-DR/Capture-IR states are used to capture the input values and for parallel load of them to either data (Capture-DR, 202) or instruction (Capture-IR, 203) register. In Shift-DR/Shift-IR states the values of data (Shift-DR, 204) or instruction (Shift-IR, 205) register are shifted one bit towards TDO with each test clock cycle. At the same time, a new value of TDI pin is shifted in. Shift-DR/IR states are used for shifting new data into registers and reading back the data that was captured in Capture-DR state. In Update-DR(206)/Update-IR(207) states the output registers are updated with the data shifted in Shift-DR/IR state. The update is done in parallel mode, so that all output values are updated synchronously.

Figure 3:
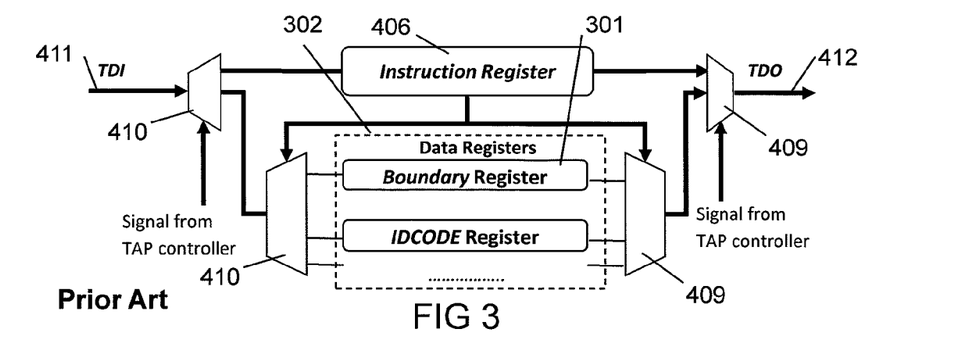
FIG. 3 illustrates the principle of organization of BS architecture (prior art)

BS/JTAG architecture incorporates Instruction Register (IR, 406) to control testing and one or several data registers 302 for feeding test data (FIG. 3). IR 406 is a shift register that holds current BS instruction. This instruction selects the test to be executed or defines which of data registers is accessed in Capture-DR, Shift-DR and Update-DR TAP state. New instruction is shifted into the IR in Shift-IR TAP state. In Update-IR TAP state shifted instruction is latched and becomes active. A process of shifting new instruction into the IR is usually called IR-shift. Data registers 302 are used for transportation of test data to the on-chip or test logic. Similar to the IR behavior, new test data is shifted serially into the data register in Shift-DR TAP state. In Update-DR TAP state the data is latched by test logic. A process of shifting new test data into the data register is called DR-shift.

Boundary Scan Register (BSR, 301) is a key data register in the BS architecture. It is mainly used for testing or programming of devices external to BS component. BSR consists of a number of BS scan-cells 408 connected in serial and thus forming a shift register (scan-chain, scan-path). BS cells are also connected with external pins of IC thus are capable to control or observe signal values on device pins 404.

The known IEEE 1149.1 instructions used for testing are SAMPLE/PRELOAD and EXTEST. SAMPLE/PRELOAD instruction selects the BSR to be accessed by DR-shift and is used to preload test data into BSR while test logic is not operating. EXTEST instruction places BS-device to test mode and makes BSR be active. In test mode the data from output or bi-direction scan-cells of BSR is driven to external pins of device while values on input or bi-direction pins of device are captured into the corresponded cells of BSR.

Figure 4:
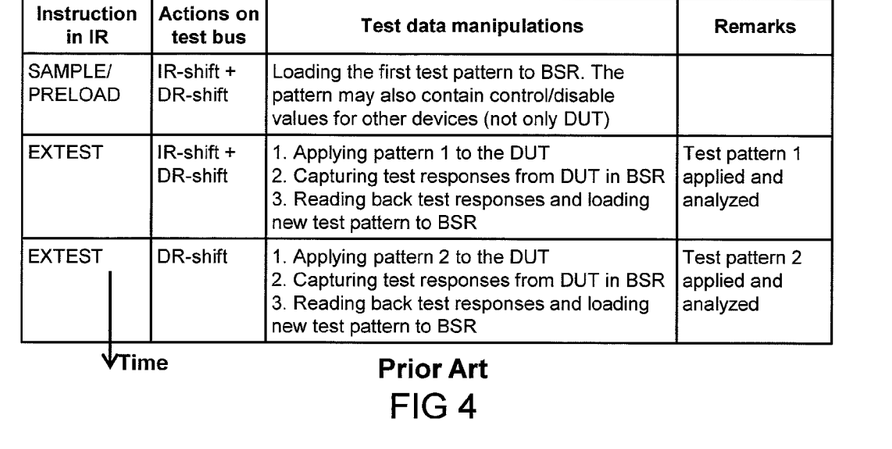
FIG. 4 describes method of testing using BS in a step-by-step manner (prior art)

BS test flow that is based on SAMPLE/PRELOAD and EXTEST instructions is depicted in FIG. 4. At first, SAMPLE/PRELOAD instruction is loaded into BS IC. Then, test data is shifted into BSR. During this step the values of the first test stimuli (test pattern) are set to the corresponding scan-cells of BS IC. After that, EXTEST instruction is loaded into BS IC and it forces IC to start driving the preloaded values of BSR scan-cells to external pins. Next DR-shift of data register is performed to set up the values of new test stimuli (test pattern) and read-back the response obtained in the previous step. The latter step is repeated until all test patterns are executed.

Figure 5:
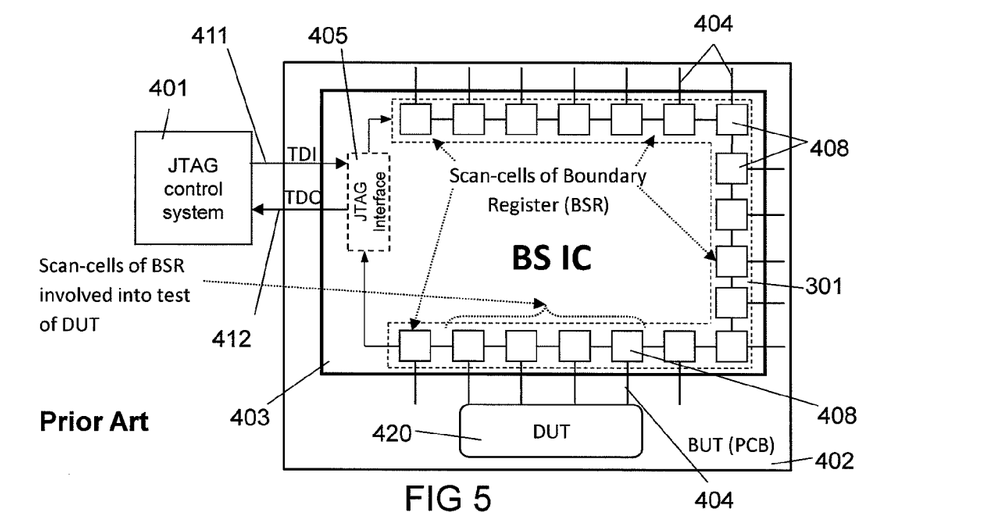
FIG. 5 illustrates the architecture of Boundary Scan shift Register (BSR) which is key component in a BS-based test method (prior art)

The described procedure is utilized for testing of interconnections between BS-compliant ICs on PCBs. It is also successfully used for testing devices (DUTs) 420 without BS structures inside (including RAM test, FLASH test and programming, etc). In the latter case, the BS-compliant device that is connected to target DUT uses BSR 301 to send the test patterns to DUT and read DUT responses In order to communicate with target DUT 420 (FIG. 5), JTAG control system 401 sequentially shifts bits (1 bit per test clock cycle) to BSR 301 via TDI 411 and JTAG Interface 405 while TAP controller is in Shift-DR state while IR is loaded with EXTEST instruction. The test data that is intended to be sent to DUT is propagated to the corresponded scan-cells 408 of BSR 301 with each test clock cycle. After the propagation is finished, the data exchange between DUT and BSR is triggered by Update-DR: the test data (stimuli, test pattern) from BSR is applied to DUT via pins 404 and the responses of DUT are captured back into BSR. Next, the responses from DUT are shifted out from TDO 412 in a similar manner: the bits of BSR are shifted along the scan-chain (1 bit per clock cycle) until all the captured values reach TDO.

Figure 6:
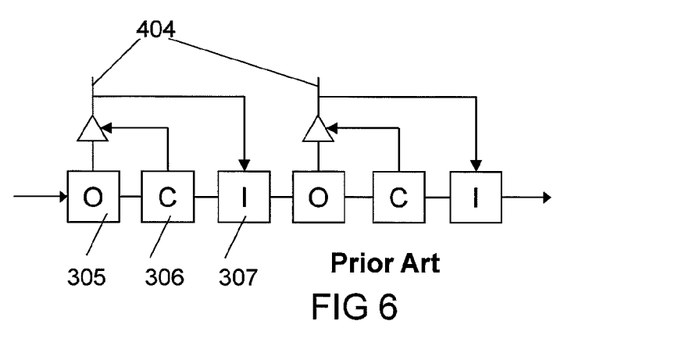
FIG. 6 shows types of scan-cells in typical BSR architecture (prior art)

As the reference, the representation of typical BSR architecture of Field Programmable Gate Array (FPGA) IC is shown in FIG. 6. In this example, BSR contains separate output scan-cell 305, control scan-cell 306 and input scan-cell 307 per each input-output (I/O) pin 404 of FPGA IC. The total length of the BSR is approximated as a number of I/O pins in FPGA device multiplied by 3.

Input scan-cell of BSR is used to capture value on the corresponded pin of FPGA. Control scan-cell is used to switch the direction (output or input) of the pin. If pin is configured as an output, then output scan-cell is used to control the value (0 or 1) driven by the pin. For example, to force pin to drive a signal using BS, the corresponded control cell is loaded with the value that configures this pin for output direction and the corresponded output cell is loaded with the desired value for signal that needs to be driven.

Due to the fixed structure of BSR there are no means that could reduce the number of the test clock cycles needed to perform test data exchange with DUT: the full shift of BSR is always required. However the data supplied to TDI with part of test clock cycles is carrying no useful information for DUT and is shifted in just for the sake of propagation of the actual test data. As a result, the main disadvantage of BS consist in essentially slow speed of test data exchange with DUT caused by the considerable amount of redundant information that need to be supplied to BSR before triggering the application of each test pattern. For example, in FIG. 5 it is needed to shift-in 18 bits of data into BSR 301 (corresponding to the total number of scan-cells 408) however only 4 bits (that correspond to the 4 cells connected with DUT 420) are actually used for test data exchange with DUT.

The other drawback of testing using BSR is the low rate of data exchange with DUT due to the pause between test pattern applications. This pause is induced by necessity to update contents of BSR by shifting in test data of new test pattern. The latter makes impossible to use BSR for testing of DUT that requires high rate of test application (i.e. small or no delay between two consecutive test patterns).

The purpose of the present invention is to overcome the abovementioned drawbacks of BS.

Known extensions to BS technique are also described in several patent documents. U.S. Pat. No. 7,248,070 and U.S. Pat. No. 7,550,995 describe method and system for using boundary scan in a programmable logic device (PLD). U.S. Pat. No. 6,925,583 and U.S. Pat. No. 7,047,467 describe structure and method for writing from a JTAG device with microcontroller to a non-JTAG Device. U.S. Pat. No. 6,594,802 describes method and apparatus for providing optimized access to circuits for debug, programming, and test. The presented architectures cannot be implemented into programmable device (PLD or FPGA) in such a form that will match any possible types of DUT or the position of DUT relatively to pins of PLD/FPGA. This means, that for each new test case, re-implementation of the architecture is required.

Patent application US2005204229 describes boundary scan tester for logic devices. This solution requires de-compressor to be implemented in electronic device along to BSR. This blocks the usage of the technique in already existing devices that do not have decompression structures inside. The speed-up is fully depending on the potential compression ratio of the incoming data that may vary.

U.S. Pat. No. 5,991,908 describes boundary scan chain with dedicated programmable routing. The described architecture is targeted to mask-programmable devices only. The disadvantages are that the architecture cannot be implemented into PLD or FPGA device in a such form that will match any possible types of DUT or the position of DUT relatively to pins of PLD/FPGA. This means, that for each new test case, re-implementation of the architecture is required.

U.S. Pat. No. 6,314,539, boundary scan register cell with bypass circuit, presents a method that supplements BSR register with for optimized test access. It does not contain methods that can be applied to existing programmable logic devices without changes in their structure. It also does not provide any system or method for optimized test application.

BRIEF DESCRIPTION OF THE INVENTION

The aim of present invention is to provide a system and method that accelerates speed and increases efficiency of test and configuration of electronic assemblies in particular printed circuit boards (PCBs). The system and method provides optimized test access to device under test (DUT) on PCB and is capable to overcome the drawbacks of state-of-the-art BS technique, namely slow test access and test application speeds.

The invention proposes to split test data into static and dynamic parts and handle both parts differently using special VLSR (Variable-Length Shift Register) architectures described below. Basing on this division, the invented VLSR architecture provides higher speed of test data exchange with DUT in comparison with BS. As a result, by using the invented VLSR it is possible to shorten the time needed to test or configure PCB. The proposed architecture is adapted according to the target protocol of DUT and its position relatively to pins of Programmable Logic Device (PLD), Field-Programmable Gate Array (FPGA) or other device with programmable logic without the requirement for re-implementation of VLSR for each particular DUT or test case.

The invention also describes VLSR with accumulating Buffer (VLSRB) architecture that is capable to sequentially issue test patterns to DUT at much higher rate than is possible in BS. The latter is crucial for testing of the devices which are operating only on higher speeds (DDR3 memories, high-speed busses and peripheral, etc.).

The proposed invention does not target to extend state-of-the-art BS technique by replacing, changing or supplementing existing BSR with extra structures (e.g. multiplexers, buffers or other elements). Instead, VLSR and VLSRB are implemented with its own architecture. However it is possible to use the invented system in conjunction with BS technique and along with BS structures (i.e. BSR) that already present in PLD or FPGA. In case if both BSR and VLSR(B) structures are present in the same device, the method for seamless switching between BSR-based testing to VLSR(B)-based testing is defined. The latter method ensures integration of the presented system into devices that already support BS (such as FPGAs and PLDs) and also simplifies adaptation of the existing BS test programs to the VLSR(B)-based test.

Unlike the previous inventions, the presented invention does not require the involvement of any data compression/decompression techniques. The implementation of special bypassing scheme enables the proposed system for on-the-fly reconfiguration of VLSR chain for meeting requirements of target DUT. The reconfiguration is performed without changes in VLSR structure programmed into FPGA, PLD or other device with reprogrammable logic and thus allows to use single implementation of VLSR architecture for testing or configuring any DUT connected to given FPGA or PLD device.

The present invention system and method for optimized board test and configuration comprises of a method for splitting test data into dynamic and static parts, a system for optimized test access using variable-length shift register (VLSR) that uses the latter method, a system for optimized test application using VLSR with accumulating buffer (VLSRB) and a method for switching between BS-based test and VLSR(B)-based test.

Splitting test data into static and dynamic parts. In BS, in order to send and receive single pattern of test or configuration data to/from DUT (test pattern) one needs to perform the full shift of BSR register (i.e. to apply the number of test clock cycles equal to the number of scan-cells in BSR). However, only the scan-cells of BSR that correspond to those pins of device that are connected with DUT are actually involved into testing/configuration process. These scan-cells (dynamic part) get new values (dynamic values) with each of test patterns. The remaining pins (and the corresponded scan-cells) are either connected with other devices on BUT or are left un-connected. The values on these pins do not need to change during the whole test session and the corresponded scan-cells (static part) hold the same values (static values) for every test pattern. In the presented invention, the static and dynamic parts of test data are identified and handled separately using VLSR architecture. This allows to use scan-path of shortened length for dynamic part and thus reduces the number of test clock cycles required to update VLSR. As a result, VLSR minimizes the time needed for sending/receiving test data to/from DUT and provides optimized test access.

VLSR architecture is based on two principles:
1) Dynamic bypassing of scan-cells
2) Grouping of scan-cells into several separate scan-chains These principles are used independently or combined together to obtain efficient shift-based architecture for test data exchange.

Dynamic bypassing of scan-cells allows VLSR to change the length of scan-chain by exclusion of part of the scan-cells from the active scan-path. The architecture is based on the usage of the special multiplexing blocks that are placed adjacently to each or part of scan-cells and are capable to selectively exclude (bypass) or include the scan-cell from/to active scan-path. It is worth to emphasize that even if a scan-cell is bypassed it is still capable to drive the value of the device pin it is connected to. Hence, the bypassed scan-cell is used to drive static values, while scan-cells of the active scan-path are used to drive or measure dynamic values that are changing with each of test patterns.

In case if VLSR contains scan-cells for each I/O pin of FPGA or PLD, then such VLSR is capable for data exchange with DUT located on any pins of device. At the same time, it is possible to exclude any subset of scan-cells from active scan-path of VLSR and therefore form active scan-path which will consist only of scan-cells that correspond to dynamic part of test data. This reconfiguration is performed on-the-fly without changing the implementation of VLSR in the PLD/FPGA device. For other DUT (located on other pins) the procedure of VLSR configuration is repeated. The advantage of the proposed VLSR architecture is that it is easily reconfigurable for any DUT.

The other principle that increases the speed of test data exchange with VLSR is grouping of scan-cells into separate scan-chains. The scan-cells of VLSR are separated into several scan-chains by their types. In particular, scan-cells of output, control and input types are distinguished. For example, in one version of VLSR implementation all scan-cells of output type are grouped into one scan-chain, all scan-cells of control type are grouped into the second scan-chain and the third, scan-chain contains the cells of input type. In this example, the length of single scan-chain is less that the total number of scan-cells and therefore fewer test clock cycles are required to update the contents of one of scan-chains. Selection of the active scan-chain is performed by loading the corresponded instruction into IR of TAP. More examples of scan-cell grouping will be described later.

The purpose of VLSRB (VLSR with accumulating Buffer) architecture is to avoid delays between application of consecutive test patterns to DUT. The proposed architecture is based on the ability of FPGA, PLD or other devices with re-programmable logic to use their resources (for example BRAM or LUTs) for allocating memory space inside the device. VLSRB utilizes this memory to implement a special buffer that is used to accumulate test data (test patterns). After the test data is accumulated inside the buffer the test patterns are being applied to DUT while responses of DUT are captured and stored in the accumulating buffer. As an outcome, using VLSRB the test pattern application is performed on much higher rate (corresponding to the rate of test clock or system clock) than it is possible in BS. After the test is finished, the external test controller will able to readout the responses of DUT from the buffer for further analysis.

A version of VLSRB architecture also features built-in comparator used for on-the-fly comparison of DUT responses with the expected ones. The expected patterns of DUT responses are passed by external tester to the accumulating buffer (along with test patterns). The latter implementation of VLSRB eliminates the need to retrieve DUT responses to external tester for comparison. As a result, the test time is reduced since external tester only needs to fetch the overall result of comparison performed by VLSRB.

In general case, each I/O pin of device is supplemented with accumulating buffer. The latter provides an ability to use single implementation of VLSRB for any location of DUT relatively to device pins. In one version VLSRB contains buffer only for part of pins that are specifically intended for connection with the external memories and high-speed busses. If VLSR architecture is used in conjunction with accumulating buffer then VLSR serves as a transport link for filling or fetching the contents of the buffer. In general case, the accumulating buffer can be used independently without involvement of VLSR register in any form. For the latter case, data exchange with the accumulating buffer is performed using separate shift register of fixed length.

Switching between BS test mode and VLSR(B) test mode. If both architectures (BS and VLSR(B)) are exist in the device simultaneously then it is possible to perform data exchange with DUT either using VLSR(B) (while BSR is disabled but present in the device) or using standard BSR (while VLSR(B) is disabled). For FPGA devices, VLSR is implemented in reconfigurable logic of FPGA while BSR still remains to be present in the fixed part of FPGA device. The invented method ensures the seamless switching between BS-based and VLSR-based (or VLSRB-based) test modes. The method provides compatibility with other BS-compliant devices on BUT (including those that do not contain VLSR(B) structures).

BRIEF DESCRIPTION OF THE DRAWINGS

The present invention is explained more precisely with references to figures added, where.

DETAILED DESCRIPTION OF THE INVENTION

The present invention, system and method for optimized board test and configuration, comprises a method for splitting test data into dynamic and static parts, a system for optimized test access using variable-length shift register (VLSR) that uses the latter method, a system for optimized test application using VLSR with accumulating buffer (VLSRB) and a method for switching between BS-based test and VLSR/VLSRB-based test.

Figure 7:
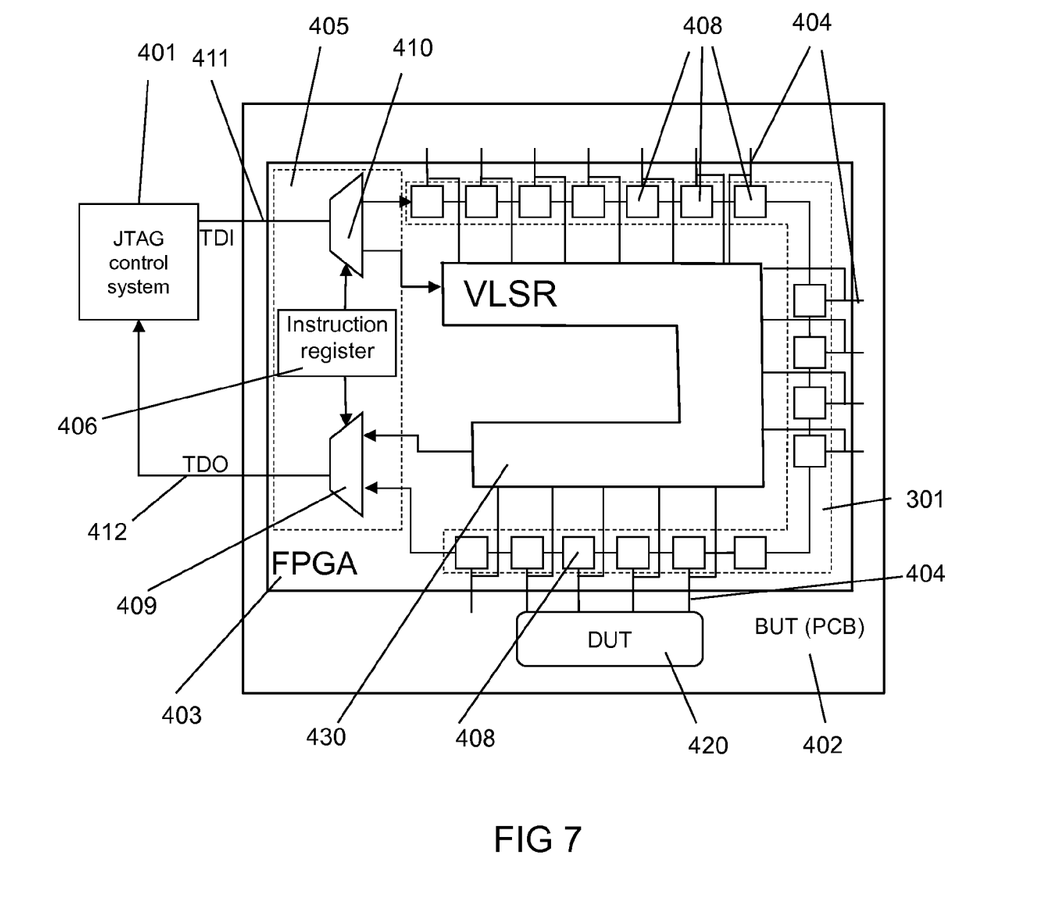
FIG. 7. shows the system according to present invention for optimized board test and configuration.

FIG. 7 illustrates a system for optimized board test and configuration that comprises JTAG control system 401 (external tester) and electronic assembly (for example printed circuit board (PCB) or any other similar carrier) 402. Electronic assembly 402 comprises programmable logic device (PLD) (for example Field-Programmable Gate Array (FPGA) or any other type of device with reprogrammable logic) 403, it's pins 404 and device under test (DUT) 420 connected to the pins of PLD 403. PLD 403 comprises internal JTAG interface 405 which comprises instruction register 406, scan-chain (BSR) consisting of scan-cells 408 that are connected with pins 404, multiplexer 409 and de-multiplexer 410, test data input (TDI) 411, test data output (TDO) 412. The re-programmable part of PLD/FPGA 403 comprises VLSR 430 or VLSRB 430 architectures (connected with pins 404 and JTAG interface 405).

JTAG interface 405 of PLD/FPGA 403 is intended for propagation of test signals from JTAG control system 401 via TDI 411 to scan-cells of BSR 408 or to one of scan-paths of VLSR(B) architecture 430 depending on the state of de-multiplexer 410. The state of de-multiplexer 410 depends on the selected instruction in the IR 406 of JTAG interface 405 or the combination of the selected instruction and the state of any other internal signals of FPGA 403. The test signals are then applied to DUT 420 via pins 404. The responses of DUT are transferred to JTAG control system 401 via multiplexer 409 and test data output 412. The transfer of test signals to/from BSR scan-chain 408 or VLSR(B) 430 as well as selection of internal instruction in the instruction register 406 is done according to IEEE 1149.1 JTAG standard.

VLSR (FIG. 8) comprises of scan-cells 501 and bypassing circuits 502, optional dummy cells (FIG. 9, 601) that are populated into one or several scan-paths as described in FIG. 10-FIG. 14. VLSRB comprises of an at least one scan-path (with or without bypassing circuits) accomplished with at least one accumulating buffer (FIG. 15).

Figure 8:
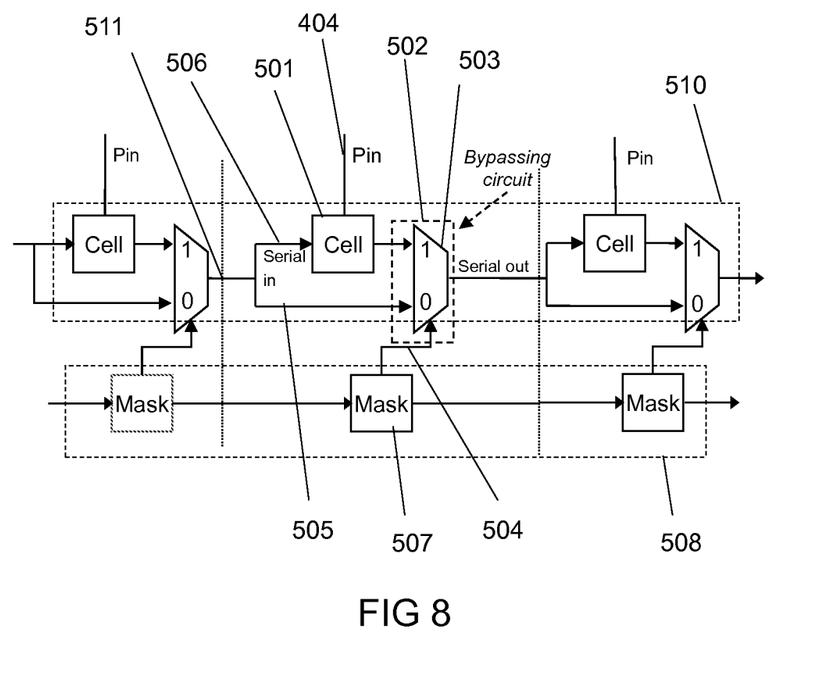
FIG. 8 shows the system with VLSR with bypassing circuits.

FIG. 8 illustrates the structure of VLSR with scan-cells 501 that are connected to pins 404 and form one or several scan-paths 510, and bypassing circuits 502 for each or part of scan-cells 501. The bypassing circuit 502 contains a multiplexing block 503 that is controlled by mask signal 504. The scan-cells 501 is either functionally correspond to one of the IEEE 1149.1 cell types (to be compatible with JTAG standard) or implement own behavior that allows to control or measure signal on device pins 404.

Depending on the state of the mask signal 504 the multiplexing block 503 performs one of the two possible functions: (1) connects the serial signal output 511 from the preceding multiplexing block directly with the input of the next scan-cell via line 505 (i.e. excludes the current scan-cell from the active scan-path 510) or (2) connects the serial signal output 511 from the preceding multiplexing block with the input of the current scan-cell via line 506 (i.e. includes the current scan-cell serially into the active scan-path 510). The multiplexing block 503 is implemented either by usage of multiplexers or by using other Boolean logic elements that realize the same function.

As a result, depending on the state of the mask signal 504 the scan-cell 501 is either included into the active scan-path 510 or is temporally excluded from the scan-path 510. For example, if mask signal equals to logic '1', then the scan-cell is included into the active scan-path. If the value of mask signal is logic '0', then the scan cell is bypassed (excluded from the active scan-path). In the latter case, during shift operation the value of the previous scan-cell is passed directly to the multiplexing block of the cell located just after the bypassed one. Several multiplexing blocks configured for bypass result in exclusion of several scan-cells from active scan-path. If several consequent multiplexing blocks are configured for bypass, then several adjacent scan-cells are removed from the active scan-path. If a scan-cell is bypassed, then the active scan-path becomes reduced (shortened) and therefore requires fewer test clock cycles to update its contents.

The mask signal 504 is either directly or indirectly controlled by one or several memory elements (flip-flop, register). In the example on FIG. 7, each of mask signals 504 is directly controlled by the dedicated flip-flop 507 (mask cell 507). In this example, mask cells are connected serially into mask register 508 and form a separate scan-chain (mask scan-chain). In this case, the state of mask signals is changed by shifting-in the corresponded data into mask register 508. By changing the values in mask register one is able to include or bypass the particular scan-cells of VLSR into/from active scan-path. The JTAG system 401 is able to change values in mask register by shifting new values through the JTAG interface 405 via TDI 411.

Usage of the invented architecture allows on-the-fly reconfiguration of scan-chain 510 of VLSR 430 If VLSR structure is programmed into PLD/FPGA device 403 then one is able to reduce the length scan-chain 510 without re-programming of PLD or FPGA.

If the scan-cell 501 is bypassed (excluded from scan-path) it is still capable to control the value of device pin 404. Bypassed scan-cell is then used to drive a value of the static part of test data. The static values are preloaded to scan-cells before the static scan-cells are excluded from active scan-path. For that, in this example, all mask cells are loaded with logic '1' value. Then static data is shifted into the scan-path 510 of VLSR.

Figure 9:
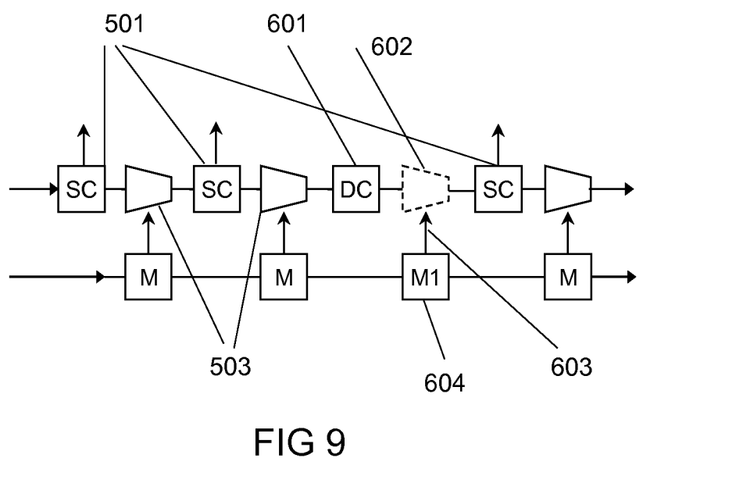
FIG. 9 shows the usage of dummy cells in the system with VLSR architecture.

FIG. 9 illustrates the usage of optional dummy cells 601 in VLSR. A dummy cell 601, represents a cell that is not connected with any pin 404 of device 403 (and thus is not capable to control or measure value on pin). The usage of dummy cells is especially important for the cases when large count of adjacent scan-cells 501 are configured to be bypassed. The latter results in an overlong extent of bypassing signal line 505 that is concatenated by the corresponded multiplexing blocks 503 and will consist of so many levels of combination logic as the number of consequent multiplexing blocks configured for bypass. In this case, significant combinational delay on bypass signal line appears. The sole purpose of dummy cells 601 is to break the long combinational signal path into parts and reduce combinational delay on bypass signal line. For the highest efficiency, the dummy cells 601 are evenly distributed among other cells 501 of VLSR.

Dummy cells 601 are either permanently present in the scan-chain 510 or are supplemented with multiplexing blocks 603 and mask signals 604. In the latter case, the purpose of multiplexing block is to selectively include or exclude dummy cell 601 into/from scan-path 510 (by setting the corresponded value of 604). In this case, JTAG control system 401 is able either to include dummy cell into scan-path when it is really needed (for decreasing combinational delay) or to bypass it (for reducing the length of scan-path).

FIG. 10-FIG. 14 illustrate the examples of structures of VLSR that comprises a group of separate scan-chains. The currently selected scan-chain (that receives data from TDI 411 and propagates data to TDO 412) depends on the states of de-multiplexer 410 and multiplexer 409 that are controlled by JTAG control system 401 via JTAG interface 405.

For the description of the principles of cell-grouping the following types of scan-cells are defined below:
I—Input cell that is only able to measure the value on pin;
O—3-state output cell that is able to drive (enabled state) a value (0 or 1) on pin or be disabled (place pin into high impedance state);
C—Control cell that controls the behavior of O-cell: enabled (driving 0 or 1) or disabled;
I/O—Bidirectional cell that is able either to drive or measure value depending on the state of the corresponded control cell;
M—Mask cell that is used to control the mask signal that controls the inclusion of scan cell into active scan-path.

Figure 10:
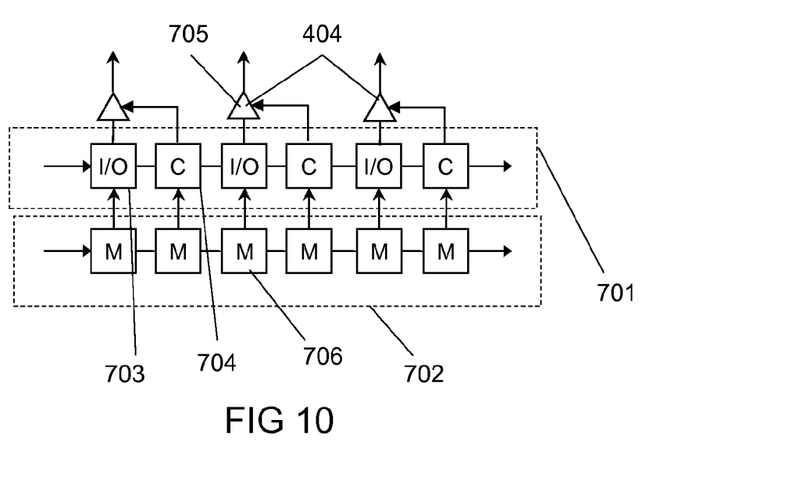
FIG. 10 illustrates an example of the implementation of VLSR using single data scan-chain 701 connected with FPGA pins 404 and single mask scan-chain 702.

FIG. 10 illustrates an example of the implementation of VLSR using single data scan-chain 701 connected with FPGA pins 404 and single mask scan-chain 702. The data scan-chain comprises combined input and output cell 703 and control cell 704 (one set of these cells per each input-output pin 404 of PLD/FPGA device 403). Depending on the value of C-cell 704 the respective pin 404 is configured either as output or input using buffer 705. When the pin is configured as output the IO-cell 703 controls contains the value that is being driven by the pin. When the pin is configured as input, then IO-cell 703 is used to capture the value measured on pin. Each or part of I/O cells 703 and C-cells 704 are supplemented with bypassing circuits 503 that are controlled by the mask cells 706 of mask scan-chain 702. The benefit of the architecture in FIG. 10 is that there is no need to switch between scan-chains during test operations: all the data are shifted into single scan-chain (after mask scan-chain is configured).

Figure 11:
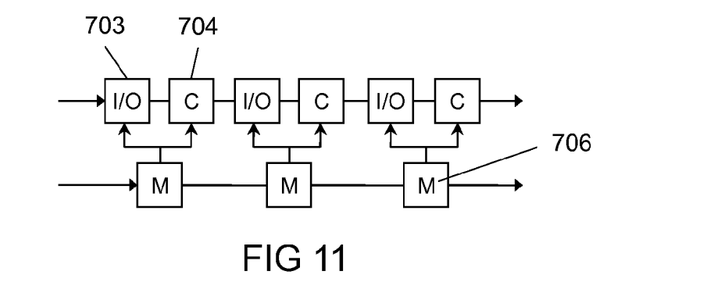
FIG. 11 illustrates an example of VLSR architecture that represents the variation of architectures in FIG. 10.

FIG. 11 illustrates an example of VLSR architecture that represents the variation of architecture in FIG. 10. The architecture in FIG. 11 shares single mask cell 706 and single bypassing circuit 503 for each pair of I/O cell 703 and control cell 704 that belong to single pin 404.

Figure 12:
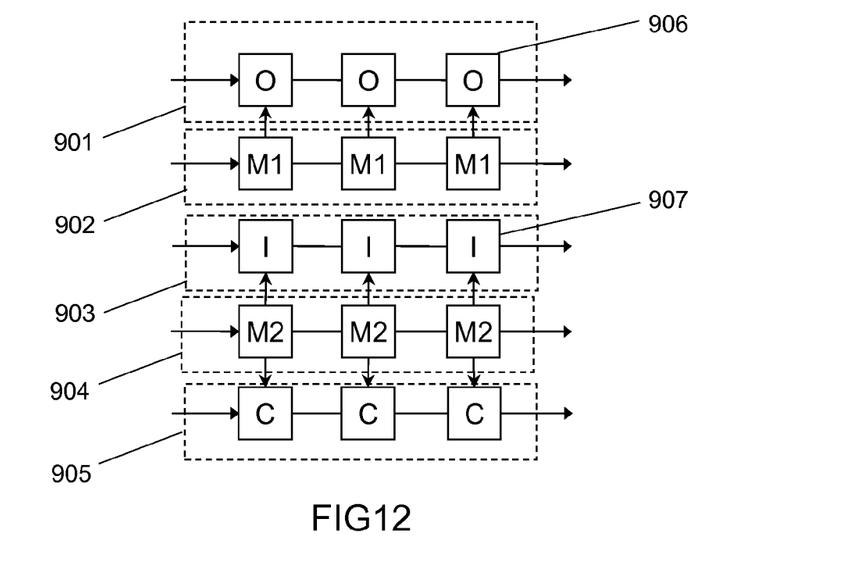
FIG. 12 illustrates an example of VLSR architecture where the cells are grouped into separate scan-chains (901, 902, 903, 904, 905) by their type.

FIG. 12 illustrates an example of VLSR architecture where the cells are grouped into separate scan-chains (901, 902, 903, 904, 905) by their type. The scan-cells are separated into scan-chain 901 (which contains cells of output type 906), scan-chain 903 (which contains cells of input type 907), and scan-chain 905 (which contains cells of control type 704). Each or part of scan-cells of chains 901, 903 and 905 are supplemented with bypassing circuits 503 that are controlled by the mask cells of mask scan-chains 902 and 904. Mask scan-chain 902 is populated with mask cells that control mask signals of bypassing circuits of scan-cells in the chain 906. Mask scan-chain 904 is populated with mask cells that control mask signals of bypassing circuits of scan-cells in the chain 903 and 905. Each mask cell in mask scan-chain 904 controls the values of both mask signals: the value of the mask signal for the corresponded I-cell in scan-chain 903 and the value of the mask signal for the corresponded C-cell in scan-chain 905. In an alternative embodiment two different mask scan-chains are used (one for input scan-cells of 903 and another for control scan-cells of 905) instead of combined scan-chain 904. The architecture in FIG. 12 is the most efficient when only single type of cells are used as dynamic cells for a long period of test session.

Figure 13:
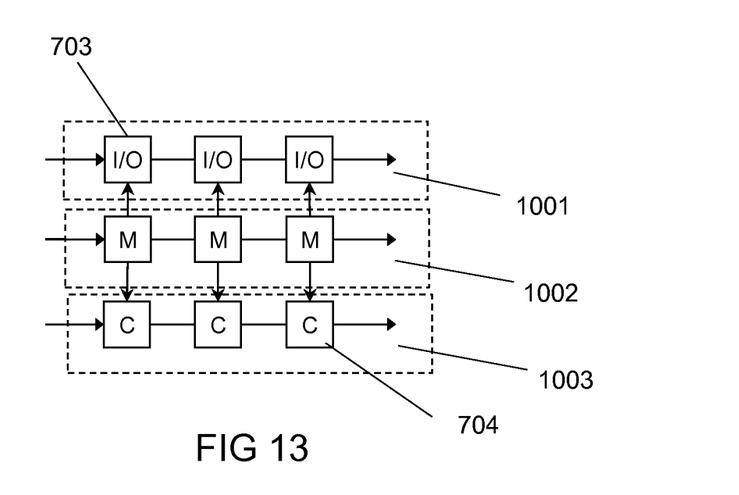
FIG. 13 illustrates an example of VLSR architecture where I/O cells 703 and control cells 704 are grouped into independent scan-chains.

FIG. 13 illustrates an example of VLSR architecture where I/O cells 703 and control cells 704 are grouped into independent scan-chains 1001 and 1003. Each or part of I/O cells 703 and C-cells 704 are supplemented with bypassing circuits 503 that are controlled by the mask cells 706 of mask scan-chain 1002. The mask cells of mask scan-chain 1002 are shared for both I/O and control scan-chains. Because the scan-path of control cells is separated, this architecture is the best choice when the direction of data (input or output test data) is stable (or changes rarely). In this case, control scan-chain 1003 is updated only once (or few times) during the test session.

Figure 14:
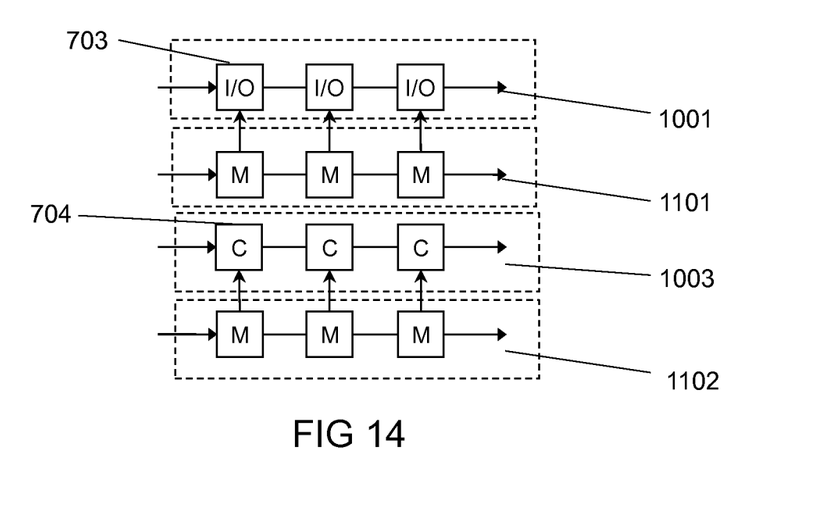
FIG. 14 illustrates an example of VLSR architecture with different mask scan-chains used to control data scan-chain.
Figure 15:
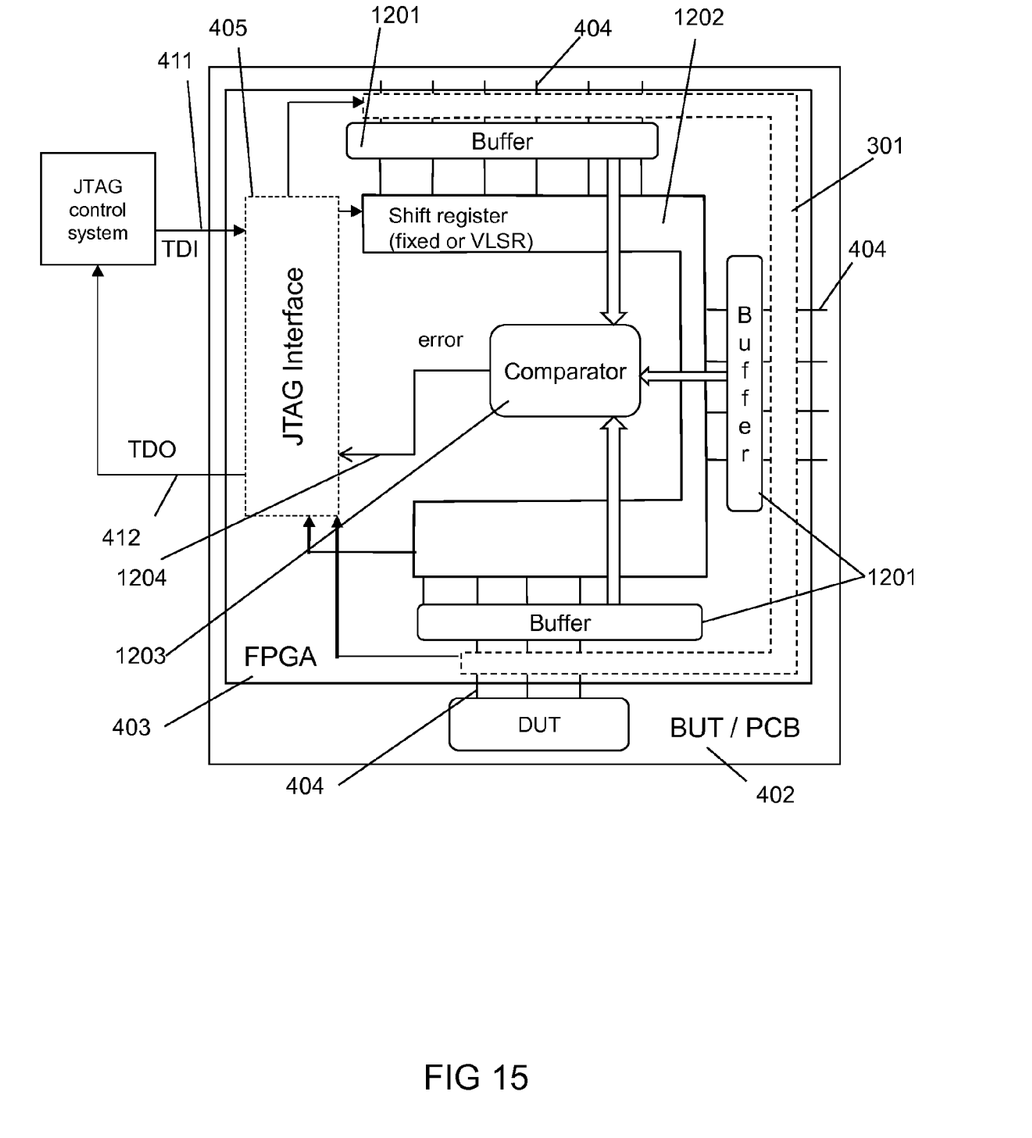
FIG. 15 shows the VLSR architecture with accumulating Buffer (VLSRB)

FIG. 14 illustrates an example of VLSR architecture which differs from the architecture in FIG. 13 in the following: separate mask scan-chains 1101 and 1102 are used to control data scan-chain 1001 (that consists of cells of I/O type) and 1003 (that consists of control cells). By using this architecture one is able to select a subset of control cells 704 that are needed for switching the direction of the data cells 703 during test session. Other control cells are bypassed (because the corresponded data cells do not require often change of direction).

FIG. 15 shows the VLSR architecture with accumulating Buffer (VLSRB). The purpose of VLSRB architecture is to minimize delays between application consecutive test patterns to DUT and thus to overcome the drawback of BS that does not allow high rate of test pattern application. VLSRB comprises accumulating buffer 1201 (implemented by means of internal memory resources of device 403), shift register 1202 (fixed-length or VLSR) connected with JTAG control system 401 via TDI 411 and TDO 412 though JTAG interface 405. A version of VLSRB implementation additionally comprises built-in comparator 1203 and error signal 1204 that is accessible via TDO 412.

The buffer 1201 is used to accumulate test data that is passed to DUT 420 during the test. After test data is accumulated in the buffer 1201 it is being applied to DUT (via pins 404 of device 403). If responses of DUT 420 are required to be examined by the tester, then DUT responses are captured and stored back in the accumulating buffer 1201. In VLSRB, the test pattern application is performed with the much higher rate (corresponding to the rate test clock or system clock) than the maximal possible test pattern application rate of BSR or VLSR.

In general case, each I/O pin of device 403 is supplemented with accumulating buffer. The latter provides an ability to use single implementation of VLSRB for any kind of test configuration (location of DUT 420 relatively to device pins 404). In this case, unused parts of the buffer (corresponding to static part—pins not involved into test) are filled with static data or are disabled. However in one version VLSRB contains buffer only for part of pins that are specifically intended for connection with the external memories and high-speed busses.

As a transport link for filling or fetching the contents of the accumulating buffer 1201 the shift register 1202 is used. Shift register 1202 is either implemented in the form of fixed shift register (one of data registers 302) or using one of VLSR architectures described above. The register 1202 is accessible by JTAG control system 401 via TDI/TDO (411, 412) pins and JTAG interface 405. In case if VLSR architecture is used for 1202, then it is possible to configure the active scan-path to contain only the scan-cells of 1202 that correspond to the parts of accumulating buffer involved into the test. This will improve the speed of test data exchange with buffer 1201. In the alternative VLSRB implementation, a fixed-length shift register is used for 1202 without involvement of VLSR in any form.

During test using VLSRB architecture, the comparison of DUT responses with the expected one is carried out using one of the two options. For the first option, the responses of DUT are saved into the accumulating buffer 1202 and are fetched by JTAG control system 401 after or during the test (for the analysis and comparison with the expected responses). For the second option, for VLSRB architectures that are supplemented with built-in comparator 1203 and error signal 1204, on-the-fly comparison of DUT responses is performed. In the latter case, the patterns of expected responses are stored in a part of the accumulating buffer 1201 beforehand (along with test patterns). During pattern application, the comparator 1203 compares DUT responses with the expected ones and in case of mismatch sets the error signal 1204. After test is finished, JTAG control system is capable to retrieve the state of error signal 1204 via TDO 412 in order to determine if the DUT responses were correct or not.

In a first embodiment the method for optimized board test and configuration is described below.

Before starting the test the device 403 is programmed with VLSR architecture if it is not already containing VLSR. All registers in VLSR are reset to their default configurations. In the default state, all VLSR registers (scan-chains) have maximum length so that all scan-cells (input, output, control, mask) of any target scan-path are serially accessible (not bypassed) during the corresponded shift operation. In general, VLSR resetting to the default configuration is not required, but is used here to simplify the description of the method.

The method comprises the following phases.
Phase 1: Splitting test data into static and dynamic parts.
Phase 2: Applying static data.
Phase 3: Reconfiguring VLSR.
Phase 4: Applying dynamic data and reading back the responses of DUT.
The phase 3 and phase 4 are repeated for each test pattern in the set of test data. Below each of the phases are explained in details.

The phase 1 of splitting test data into dynamic and static parts is performed on the JTAG control system 401. Before the test starts the scan-cells 404 of BSR are identified as either dynamic or static. This identification is carried out either basing on test pattern set (how frequently the test data inside each cell is changing with every new test pattern) or basing on connection of cells with DUT 420. For the first option the cells in which test data is changing frequently are marked as dynamic while the rest of cells are marked as static. For the second option, dynamic cells are those that correspond to the pins 404 that are connected to DUT 420. The static cells are those that correspond to the pins 404 that are either connected with other devices on PCB 402 or are left unused. The information about dynamic and static parts is passed to VLSR to configure it accordingly in phase 3.

In phase 2, the static cells are loaded with the static values that will be driven throughout the whole test session. The phase comprises the following steps:

Step 1. Select target scan-chain 510 populated with scan-cells 501. This is done by loading the corresponded instruction (that activates target scan-chain) into IR 406 using IR-shift.

Step 2. Shift-in static data into the selected chain via TDI 411 using DR-shift operation.

Step 3. If the VLSR consists of several scan-chains populated with scan-cells, then steps 1 and 2 are repeated until all the target chains are filled-in with the prepared corresponded static data.

For the example in FIG. 7 and FIG. 8, then scan-chain 510 is selected as target scan-chain by loading the corresponded instruction into the IR 406 using IR-shift. Static data is then shifted into the scan-cells of VLSR scan-path 510 via TDI 411.

For the example in FIG. 12, the static values shifted into all three data scan-chains (901, 903, 905) iteratively.

In phase 3, VLSR architecture is reconfigured to include those scan-cells 501 into the active scan-path 510 that correspond to the previously defined dynamic part of test data. The reconfiguration is performed by changing the values of mask signals 504. This phase comprises the following steps:

Step 1. Select target mask register (mask scan-chain). This is done by loading the corresponded instruction (that activates target scan-chain) into IR 406 using IR-shift.

Step 2. Prepare VLSR configuration data for selected mask register.

The configuration data contains such value for mask signals 504 of static scan-cells 501 that forces static scan-cells to be excluded from active scan-path 510. The value for mask signals of dynamic scan-cells is such that forces dynamic scan-cells to be included into active scan-path. If VLSR architecture contains dummy cells 601 supplemented with bypassing circuit 602 and mask cell 604, then mask cells 604 contains the value to either include dummy cell into active scan-path or to exclude it (depending on amount of adjacent scan-cells that are bypassed (excluded) before and after the particular dummy cell).

Step 3. Shift-in VLSR configuration data into the selected mask register via TDI 411 using DR-shift operation.

Step 4. If the VLSR has several mask registers then steps 1-3 are repeated until all the target mask registers are filled-in with the corresponded configuration data.

Step 5 (optional, only for the cases, when both VLSR and BS architectures are present in the devices on BUT). Activate VLSR architecture (and deactivate BSR if BSR is present in the device). The exact method of switching between BSR and VLSR based test will be provided later.

For the example in FIG. 8, the logic value '1' forces the corresponded scan-cells 501 to be included into active scan-chain 510 (FIG. 7 and FIG. 8). Then VLSR configuration data is prepared in such a way that all mask-cells 507 that control mask signals 504 that control bypassing circuits of dynamic scan-cell would contain logic '1'. The rest of mask cells are set to logic '0'. This configuration data is then shifted into mask register 702.

In the example in FIG. 12, the corresponded VLSR configuration data is prepared and loaded iteratively for both of mask scan-chains 902 and 904.

Phase 4. This phase is used to update dynamic scan-cells of VLSR with new dynamic test data and apply the updated test data to DUT 420. The speed of updating data cells is much higher than in BS since fewer number of clock cycles is needed to load the shortened scan-chain with test data than to load full scan-chain of BSR. The phase comprises the following steps:

Step 1. Select target scan chain populated with dynamic scan-cells. This is done by loading corresponded instruction (that activates target scan-chain) into IR 406 using IR-shift operation.

Step 2. Shift-in dynamic data into the selected chain via TDI 411 using DR-shift operation. At the same time, the responses of DUT captured for the previous test pattern are shifted out via TDO to JTAG control system 401.

Step 3. If the VLSR consists of several scan-chains populated with dynamic scan-cells, then steps 1 and 2 are repeated until all the target chains are updated with the corresponded dynamic test data.

Step 4. In VLSR, the updated data is applied to DUT 420 via pins 404 while the DUT response is captured back into VLSR.

For the example in FIG. 7, in the beginning of the phase 4, active scan path 510 is selected as a target scan-chain. After that, the dynamic test data is shifted scan-cells 501 of shortened active scan-path 510 via test data input 411. After all the corresponded scan-cells 501 that will contain dynamic test data, the test data is applied to DUT 420.

The phase 3 and phase 4 are repeated for each test pattern in the set of test data.

Figure 16:
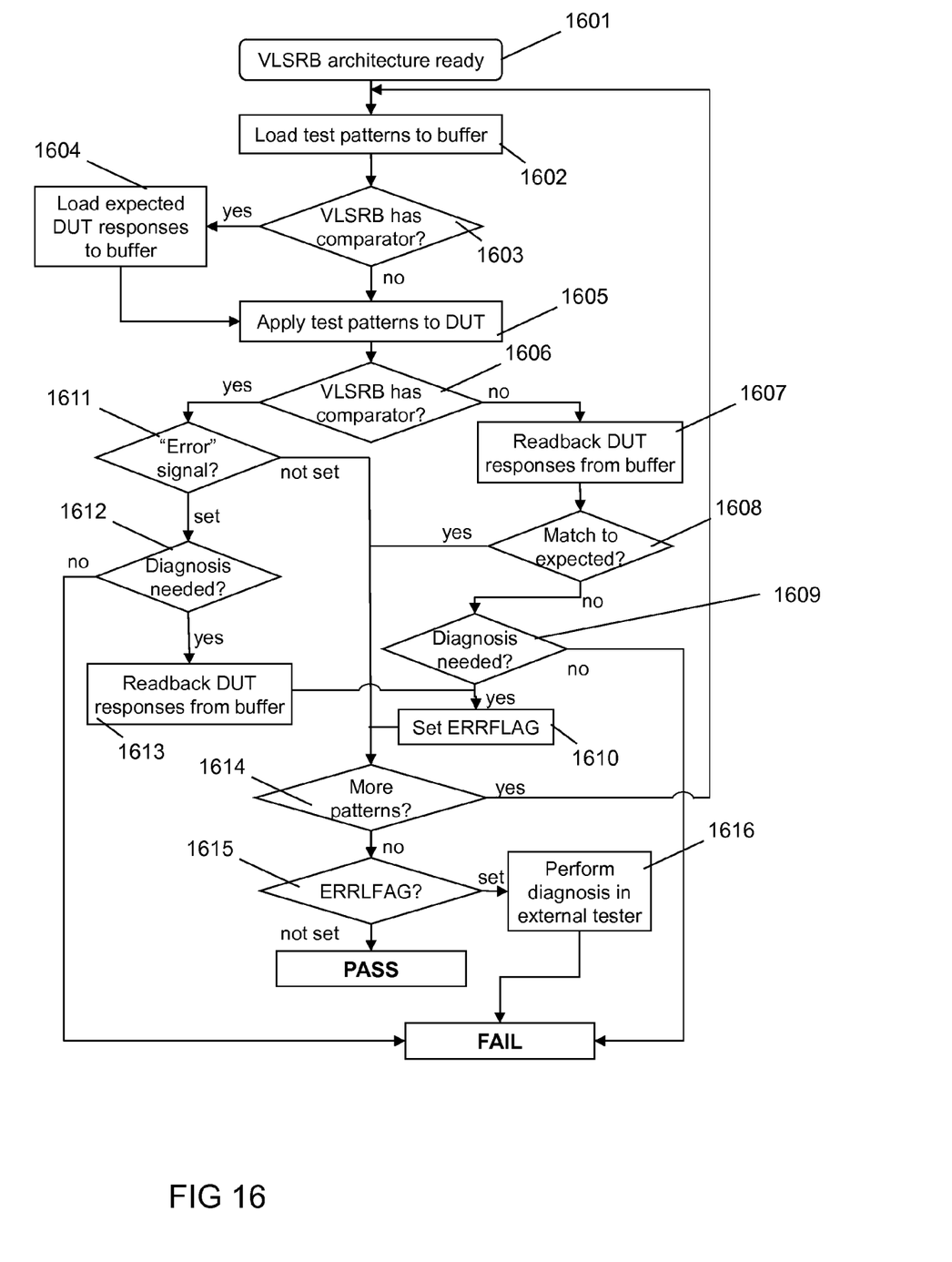
FIG. 16 illustrates example of test execution flow using VLSRB architecture.

The method for optimized board test and configuration is carried out as a VLSRB-based test comprises following steps (FIG. 16):

Step 1 (1601). Before starting the test the device 403 is programmed with VLSRB architecture if it is not already containing VLSRB.

Step 2 (1602) is used to preload test patterns for DUT 420 into the accumulating buffer 1201 of VLSRB.

During this mode the test data is supplied by JTAG control system 401 using test data input 411 and stored as contents of buffer 1201. The loading process continues until the buffer is full or the set of test patterns is exhausted. The test data exchange with the buffer 1201 is performed using one of two possible methods depending on the implementation of the particular VLSRB architecture. In case, if shift register 1202 is implemented as VLSR structure, the data exchange is performed in the same manner as described in phases 1-4 of the first embodiment. The only difference is that in phase 4 (step 4) the dynamic test data is stored inside the buffer 1201 instead of being applied to DUT.

In case, if 1202 is implemented as a shift register without capabilities of VLSR then both parts of test data (static and dynamic) are transferred into buffer 1201 using single DR-shift operation.

Step 3 (1603). In case if the particular VLSRB architecture implements built-in comparator 1203 and error signal 1204 the execution continues to step 4 and otherwise continues to step 5.

Step 4 (1604) is used to preload patterns of expected responses of DUT 420 into the accumulating buffer 1201 of VLSRB. The loading process is the same like in step 2. In an alternative version of the invention step 4 and step 2 are united into single step.

Step 5 (1605). In this step all the preloaded test patterns are applied to DUT 420 while the responses of DUT are stored in the buffer 1201. For the implementation with built-in comparison 1203, the responses issued by DUT 420 are compared with the expected ones (preloaded in Step 4) and the error signal 1204 is set in case of mismatch.

Step 6 (1606). In case if the particular VLSRB architecture implements built-in comparator 1203 and error signal 1204 the execution continues to step 11 and otherwise to step 7.

Step 7 (1607). In this step, the captured responses of DUT are retrieved from the buffer 1201 via test data output 412 to the JTAG control system 401.

Step 8 (1608). In this step, the previously retrieved responses of DUT are compared to the expected by JTAG control system 401. In case if responses are matching to the expected, the execution continues to step 14, otherwise to step 9.

Step 9 (1609). In case if diagnostic information about the failure is requested then continue execution to step 10, otherwise the execution is finished (test failed).

Step 10 (1610). JTAG control system 401 sets the internal ERROR flag and continues the execution to step 14.

Step 11 (1611). This step is used to determine whether error was detected during test pattern application (signal 1204 was set) or not. The value of error signal is retrieved by JTAG control system 401 using test data output 412 and the multiplexer 409 which is configured to select error signal for propagation to TDO 412. For that, the corresponded instruction is loaded into IR 406.

Step 12 (1612). In case if diagnostic information about the failure is requested then continue execution to step 13, otherwise the execution is finished (test failed).

Step 13 (1613). In this step, the captured responses of DUT are from the buffer 1201 via test data output 412 to the JTAG control system 401.

Step 14 (1614). In this step, the JTAG control system 401 checks whether all the desired test patterns have been applied to DUT 420 or not. If there are patterns remaining, the execution continues to step 2 in which the next set of test patterns is loaded into the accumulating buffer 1201. In case, if all the test patterns have been already applied the execution continues to step 15.

Step 15 (1615). In case if ERROR flag was set before then continue execution to step 16, otherwise the execution is finished (test is passed).

Step 16 (1616). In this step, JTAG control system 401 runs diagnostic procedure basing on retrieved responses of DUT. The particular algorithm of analysis of DUT responses for diagnosis is out of scope of this invention. After this step, the execution is finished (test is failed).

The method of switching between BS test mode and VLSR (B) test mode comprises the following steps.

Step 1. Program device 403 with the design that contains VLSR(B) architecture (if it is not already containing VLSR (B)). Device 403 also contains the fixed BS structures inside.

Step 2. Load SAMPLE/PRELOAD instruction into instruction registers of BS-compliant ICs 103 of BUT 402 using IR-shift (including devices 403 containing VLSR(B) architectures).

Step 3. Preload test values (static and dynamic) for BUT into BSR 301 of the device 403 and BSRs of other BS-compliant ICs 103 using DR-shift.

Step 4. Upload the same values into scan-paths 510 of VLSR 430 or buffer 1201 VLSRB (while it is disabled, not driving values). The values are loaded using the methods described above (phase 2).

Step 5. Switch to BS test mode: load EXTEST instruction into instruction registers of BS-compliant ICs 103 (including devices 403 that contain VLSR(B) architectures) on BUT 420. After this step, BUT 402 is placed into test mode according to JTAG standard and is controlled by previously uploaded test values.

Step 6. Activate VLSR(B) 430 and deactivate BSR. This is done by loading special instruction into IR 406 of device 403 that contains VLSR(B). At the end of loading the instruction (in Update-IR TAP state) BSR is deactivated and VLSR becomes activated. Since VLSR is driving the same values as BSR was driving and the switching is performed within single test clock-edge, no glitches or instabilities will occur on pins 404 of device 403.

Step 6. Perform test tasks using VLSR(B) using one of the methods described previously (phase 3 and 4) while BUT is in test mode.

Step 7 (optional, needed only if BS test is planned after VLSR(B) test). Deactivate VLSR and activate BSR by loading EXTEST instruction into IR 406 of device 403 with VLSR(B) architecture. At the end of loading of instruction (in Update-IR TAP state) the VLSR is deactivated and BSR becomes activated. Since BSR contains the same values as VLSR was driving and the switching is performed within single test clock-edge, no glitches or instabilities will occur on pins 404 of device 403.

The invention claimed is:

1. A system for optimized board test and configuration, the system comprising:
 a JTAG (Joint Test Action Group) control system; and
 an electronic assembly, wherein
 the electronic assembly comprises a programmable logic device with pins and a device under test connected to the pins of the programmable logic device,
 a fixed part of the programmable logic device comprises an internal JTAG interface which comprises an instruction register, JTAG scan-cells that are connected with the pins of the programmable logic device, a multiplexer, a de-multiplexer, a test data input (TDI), and a test data output (TDO),
 a reprogrammable part of the programmable logic device comprises a Variable-Length Shift Register with an accumulating buffer (VLSR(B)) architecture connected with the pins,
 a JTAG interface comprises a group of separate scan-chains, and
 the VLSR(B) comprises scan-cells connected to the pins and form one or more scan-path, wherein each or part of cells are supplemented with bypassing circuits.

2. The system according to claim 1, wherein each bypassing circuit contains a multiplexing block that is controlled by a mask signal.

3. The system according to claim 1, wherein each bypassing circuit contains a multiplexing block that is controlled by a mask signal and each mask signal is controlled by a separate mask cell.

4. The system according to claim 1, wherein each bypassing circuit contains a multiplexing block that is controlled by a mask signal, each mask signal is controlled by a separate mask cell and mask cells form one or more mask scan-chains.

5. The system according to claim 1, wherein each bypassing circuit contains a multiplexing block that is controlled by a mask signal and single shared mask cell is used to control mask signal of scan-cell of input/output type and mask signal of scan-cell of control type, provided these scan-cells are connected with the same pin.

6. The system according to claim 1, wherein scan-path contains dummy cells that are not connected to any of the pins.

7. The system according to claim 1, wherein scan-path contains dummy cells that are not connected to any of the pins and each or part of dummy cells are accomplished with bypassing circuits, mask signals and mask cells.

8. The system according to claim 1, wherein scan-cells are grouped into scan-paths according to the types of scan-cells.

9. The system according to claim 1, wherein scan-cells are grouped into scan-paths according to the types of scan-cells and scan-cells are grouped into the following scan-paths: scan-path that comprises scan-cells of an output type; scan-path that comprises scan-cells of an input type; scan-path comprises scan-cells of control type.

10. The system according to claim 1, wherein scan-cells are grouped into scan-paths according to the types of scan-cells and scan-cells are grouped into the following scan-paths: scan-path that comprises scan-cells of input/output type; scan-path that comprises scan-cells of control type.

11. A system for optimized board test and configuration, the system comprising:
 a JTAG (Joint Test Action Group) control system and;
 an electronic assembly, wherein
 the electronic assembly comprises a programmable logic device with pins and a device under test connected to the pins of the programmable logic device,
 a part of the programmable logic device comprises an internal JTAG interface which comprises an instruction register, JTAG scan-cells that are connected with the pins of the programmable logic device, a multiplexer, a de-multiplexer, a test data input (TDI), a test data output (TDO), and a reprogrammable part of the programmable logic device comprises a Variable-Length Shift Register with an accumulating buffer (VLSR(B)) architecture connected with the pins,
 a JTAG interface comprises a group of separate scan-chains, and the VLSR(B) comprises at least one scan-path accomplished with at least one accumulating buffer.

12. The system according to claim 11, wherein the VLSR(B) accomplished with a comparator and an error signal line.

* * * * *